United States Patent
Kazutaka et al.

(10) Patent No.: US 6,787,828 B2
(45) Date of Patent: Sep. 7, 2004

(54) OPTICAL-GATE TRANSISTOR AND METHOD OF MANUFACTURING THE SAME

(75) Inventors: Terashima Kazutaka, Hsinchu (TW); Shun-Hung Hsu, Hsinchu (TW); Chiung-Yu Chang, Hsinchu (TW); Mu-Jen Lai, Hsinchu (TW)

(73) Assignee: Vtera Technology Inc., Hsinchu (TW)

( * ) Notice: Subject to any disclaimer, the term of this patent is extended or adjusted under 35 U.S.C. 154(b) by 0 days.

(21) Appl. No.: 10/635,579

(22) Filed: Aug. 7, 2003

(65) Prior Publication Data

US 2004/0113184 A1 Jun. 17, 2004

(30) Foreign Application Priority Data

Dec. 12, 2002 (TW) ........................................ 91136030 A

(51) Int. Cl.[7] .......................................... H01L 31/062
(52) U.S. Cl. ....................................... 257/290; 438/57
(58) Field of Search ............................ 257/290; 438/57

(56) References Cited

U.S. PATENT DOCUMENTS

| | | | |
|---|---|---|---|
| 5,021,361 A | * | 6/1991 | Kinoshita et al. ............. 438/23 |
| 6,355,945 B1 | | 3/2002 | Kadota et al. |
| 6,586,272 B1 | * | 7/2003 | Song ........................... 438/94 |

* cited by examiner

Primary Examiner—Long Pham
(74) Attorney, Agent, or Firm—Rabin & Berdo, P.C.

(57) ABSTRACT

The invention provides a method of manufacturing an optical-gate transistor. A BP buffer layer is formed on a silicone substrate first, and a first AlN layer is then formed for offsetting strain in the layers deposited on the first AlN layer. Subsequently, a GaN layer and an n-type AlN layer are successively deposited to form a hetero-junction at the interface. A selective epitaxy or anisotropic etching of a GaN-group material is conducted to form a prism-shaped, light-receiving layer with a cubic lattice. The prism-shaped, light-receiving layer focuses incident light to induce electrons in the n-type AlN layer, which then form a high-speed 2DEG in the GaN layer, thereby increasing the power and sensitivity of the transistor being controlled by illumination.

6 Claims, 5 Drawing Sheets

OPTICAL-GATE TRANSISTOR AND METHOD OF MANUFACTURING THE SAME

This application claims the benefit of Taiwan application Serial No. 91136030, filed Dec. 12, 2002.

BACKGROUND OF THE INVENTION

1. Field of the Invention

The invention relates in general to an optical-gate transistor and method of manufacturing the same, and more particularly to an optical-gate transistor, in which a prism-shaped, light-receiving layer is formed between a source electrode and a drain electrode instead of a gate electrode, and method of manufacturing the same.

2. Description of the Related Art

In the twenty-first century, information technology has moved into the terabyte era. Optoelectronic technology plays a very important role in transmitting, processing, storing, and displaying terabyte information. The optoelectronic integrated circuit (OEIC) uses a type of manufacturing technology, which incorporates optical devices and electronic devices on a substrate. OEIC is a technique with high potential in optoelectronic technology because devices made in this manner have smaller volume, lower cost, and higher stability during operation.

FIG. 1 shows a cross-sectional view of an OEIC structure disclosed in U.S. Pat. No. 6,355,945. In this configuration we see that a typical OEIC has a photodiode 12 as an optical circuit region and a metal semiconductor field effect transistor (MESFET) 14 as an electronic circuit region on a gallium-arsenic (GaAs) substrate 11. The photodiode 12 is composed of an n-type gallium-nitride (GaN) layer 12a and a p-type GaN layer 12b, and the MESFET 14 includes a source electrode 14a, a gate electrode 14b, and a drain electrode 14c. A conducting wire 16 connects the n-type electrode 18a of the photodiode 12 and the gate electrode 14b of the MESFET 14 to electrically couple the optical circuit region and the electronic circuit region.

When the incident light 19 is received by the p-type GaN layer 12b of the photodiode 12, a photoelectric current is generated in the photodiode 12 and then converted to an electrical signal, which provides voltage for the gate electrode 14b via the conducting wire 16. Therefore, the OEIC can be effectively used as a photoelectric switch when bias voltage is applied to the source electrode 14a and the drain electrode 14c.

In practical applications, using thermal diffusion or an iron implantation method, an n-type silicone substrate 13, a p-type source-electrode region 15, and a p-type drain-electrode region 17 are sequentially formed on a part of the GaAs substrate 11. Afterwards, a source electrode 14a, a gate electrode 14b, and a drain electrode 14c are formed by a photolithography and etching method to complete the process of manufacturing MESFET 14. Subsequently, an n-type GaN layer 12a and a p-type GaN layer 12b are successively formed on another part of the GaAs substrate 11. An n-type electrode 18a and a p-type electrode 18b are further formed by a photolithography and etching method to complete the process of fabricating the photodiode 12. Due to the large lattice mismatch between the GaN layer 12a and the GaAs substrate 11, lattice defects are easily generated as the GaN layer 12a is deposited. For this reason, a zinc-oxide (ZnO) buffer layer 10 is deposited on the GaAs substrate before the GaN layer 12a. Since the lattice mismatch between the ZnO material and the GaAs substrate 11 is relatively low, a better GaN layer 12a can be formed on the GaAs substrate 11.

However, as shown in FIG. 1, the typical OEIC uses a photodiode 12 for receiving the incident light 19, which is then converted to an electric signal for controlling the gate electrode 14b of MESFET 14. This procedure of manufacturing a photodiode for receiving the incident light in order to control the MESFET 14 is unnecessary though, since the incident light can be received directly by the OEIC-designed MESFET. This prevents waste of accessible space in the integrated circuit and reduces fabrication costs.

Moreover, the photoelectric current generated by the incident light 19 and received by the photodiode 12 will be unstable, thereby providing unstable voltage for the gate electrode of the MESFET 14. In addition, the gate electrode voltage caused by the photoelectric current has to be higher than a threshold voltage to generate a drain current. As a result, the sensitivity of the OEIC device being controlled by the illumination will be reduced.

Furthermore, as shown in FIG. 1, the conductivity of the MESFET 14 is increased by the doped silicone substrate 13 under the gate electrode 14b, but the impurities doped in substrate 13 will also block electrons from moving between the source and the drain electrodes, thereby lowering the electron mobility in the transistor. As OEIC applications tend to develop devices of high gain, high power, and high frequency, the issue mentioned above causes considerable restrictions. A high electron mobility transistor (HEMT) was invented to solve the issue of hetero-junction between two GaN-group materials with different band gaps. A narrow potential well is generated at the interface of the two GaN-group materials within the band-gap offset, where the electrons can move at a high speed without obstacles, thereby forming a two-dimensional electron gas (2DEG). This can be applied to devices using higher frequency and higher power. However, the drain current of the HEMT transistor is still controlled by the gate electrode, and the 2DEG effect has not yet been applied to the design of OEIC devices.

SUMMARY OF THE INVENTION

It is therefore an objective of the invention to provide an optical-gate transistor by designing a prism-shaped, light-receiving layer between the source and drain electrodes so that the incident light can be directly received by the transistor and then focused to induce a 2DEG at the hetero-junction interface between two GaN-group materials, thereby increasing the sensitivity of the transistor being controlled by illumination and improving the power and performance of the optical-gate transistor.

The invention achieves the above-identified objectives by providing a method of manufacturing an optical-gate transistor as described below.

A silicone substrate is formed first, and a boron-phosphide (BP) buffer layer is then formed by a halide vapor phase epitaxy. Afterwards, a first aluminum-nitride (AlN) layer, a GaN layer, and an n-type AlN layer are successively formed on the buffer layer by metal organic chemical vapor deposition. A second AlN layer is continuously formed by metal organic chemical vapor deposition. A source-electrode region and a drain-electrode region are then formed by a photolithography and etching method. Subsequently, the second AlN layer is etched to form a prism-shaped, light-receiving layer. Source and drain electrodes are formed last. The incident light is focused by the prism-shaped, light-receiving layer, which further induces a photoelectric current in the n-type AlN layer. The induced electrons fall into the adjacent GaN layer to form a high-speed 2DEG. In this way, the power and performance of the optical-gate transistor can be enhanced.

The invention achieves the above-identified objectives by providing an optical-gate transistor structure. The transistor includes a silicone substrate, a BP buffer layer formed on the substrate, a first AlN layer formed on the buffer layer, a GaN layer formed on the first AlN layer, a source electrode, an n-type AlN layer, and a drain electrode, which are formed on the GaN layer, and a prism-shaped, light-receiving layer formed on the n-type AlN layer. The n-type AlN layer is positioned between the source and drain electrodes. The prism-shaped, light-receiving layer can focus the incident light, and thus improve the sensitivity of the transistor being controlled by illumination.

Other objectives, features, and advantages of the invention will become apparent from the following detailed description of the preferred but non-limiting embodiments. The following description is made with reference to the accompanying drawings.

DETAILED DESCRIPTION OF THE INVENTION

As described above, in order to form a prism-shaped, light-receiving layer between the source electrode and the drain electrode of the transistor, the feature of the invention is that a BP buffer layer is formed on the substrate first and the GaN-group materials are then deposited so that the GaN-group layers will have a cubic lattice. The cubic lattice has lattice surfaces <100> and <111>, and thus the prism-shaped, light-receiving layer can be easily formed by epitaxy or the etching method. Therefore, the sensitivity of the transistor being controlled by illumination is improved according to the method of the invention.

Figure 1:
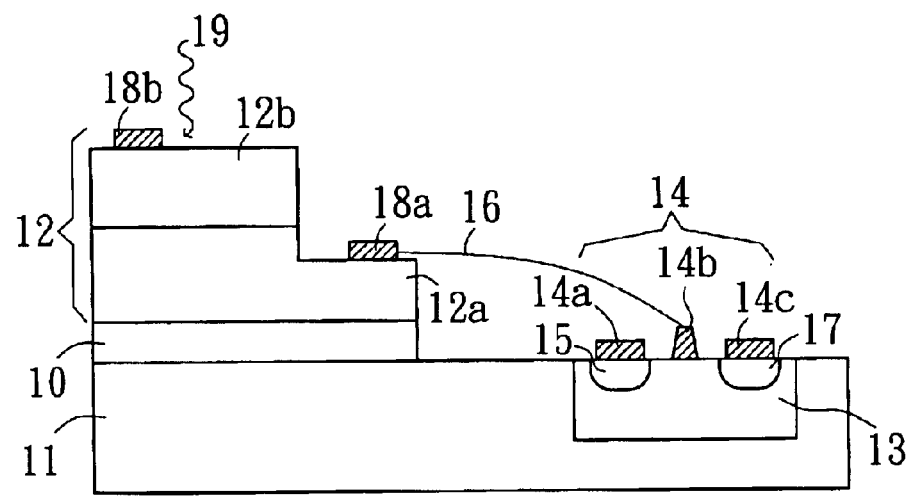
FIG. 1 (Prior Art) is a cross-sectional view of a typical OEIC structure.
Figure 2A:
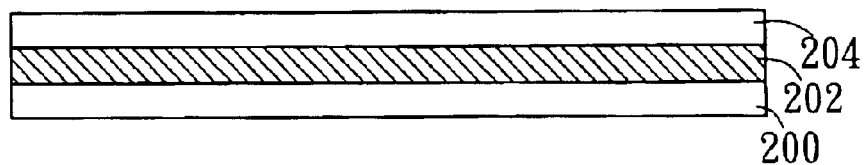
FIGS. 2A to 2D illustrate the manufacturing steps for an optical-gate transistor according to a preferred embodiment of the invention.

Referring to FIG. 2A, in order to form GaN-group layers with a cubic lattice, a BP buffer layer 202 is formed on the lattice surface <100> of a silicone substrate 200. An AlN layer 204 is formed afterwards. The buffer layer 202 is formed by a halide vapor phase epitaxy as follows. The silicone substrate 200 is heated to 900□ in a carrier gas $H_2$. Boron-chloride (BCl) and phosphorous-chloride (PCl), or BCl and hydrogen-phosphide (HP), are used as precursors. Low-temperature BP epitaxy at about 300□ is first conducted until the BP layer is deposited to a thickness of 400 nm, and then the BP layer is deposited continuously at about 1000□ for sixty minutes until it reaches a total thickness of 4560 nm.

In addition, the AlN layer 204 is used as a method of avoiding line defects generated by a mismatch between the silicone substrate 200 and the buffer layer 202, and offsetting strain in the semiconductor layer deposited afterwards to form a better deposition structure. The AlN layer 204 can be formed by a metal organic chemical vapor deposition (MOCVD) process as follows. Methyl hydrazine (MMH) and Trimethylaluminum (TMA) are used as precursors. A hydrogen gas and a nitrogen gas are supplied first, and then MMH is supplied when the temperature range reaches 350□ to 500□. After three minutes, TMA is then supplied for twenty minutes. Subsequently, the TMA supply is stopped, and the chamber is heated to 800□ after five minutes. During this time, MMH is continuously supplied. Afterwards, a second round of TMA is supplied at the same temperature for sixty minutes, as well as MMH. Lastly, the TMA and MMH supply is stopped, and the temperature is maintained for thirty minutes. When the temperature is lowered to room temperature, the AlN epitaxy process is complete. The AlN layer 204 can be any GaN-group material $Al_xIn_yGa_zN$ where $0<x+y+z<1$.

Figure 2B:
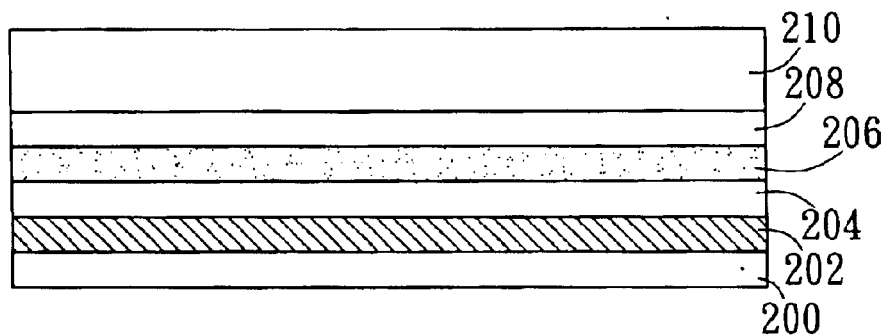

Referring to FIG. 2B, subsequently, a GaN layer 206, an n-type AlN layer 208, and an AlN layer 210 are successively formed on the AlN layer 204. The epitaxy of these three layers can be conducted by the same method used for the AlN layer 204 mentioned above, but for the GaN layer 206, MMH and Trimethylgallium (TMG) are used as precursors. The n-type AlN layer 208 is doped with a silicone impurity by high-temperature thermal diffusion or iron implantation. The n-type AlN layer 208 is used to supply more free electrons as induced by illumination; the GaN layer 206 is used to separate these free electrons from impurities in the GaN layer 208 to improve electron mobility; while the AlN layer 210 is used to form a light-receiving layer. The GaN layer 206, the n-type AlN layer 208, and the AlN layer 210 can be any GaN-group material $Al_xIn_yGa_zN$ where $0<x+y+z<1$.

Figure 2C:
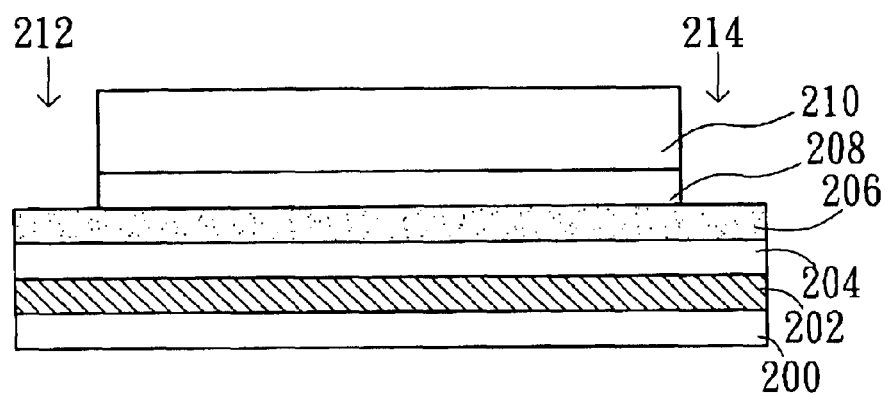

Afterwards, a source-electrode region 212 and a drain-electrode region 214 are formed by a photolithography and etching method as shown in FIG. 2C. Lastly, a prism-shaped, light-receiving layer 216 is formed by an anisotropic etching method, such as wet etching using potassium hydroxide (KOH) or hydrogen-fluoride (HF), and a source electrode 212a and a drain electrode 214a are then formed to complete the fabrication of an optical-gate transistor.

Figure 2D:
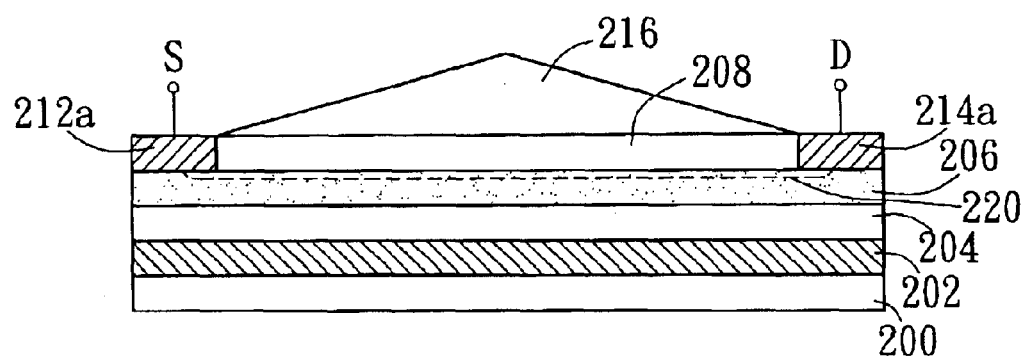
Figure 2E:
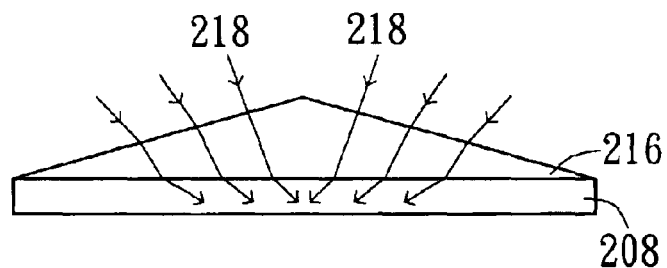
FIG. 2E is a schematic view of an incident light focused by the prism-shaped, light-receiving layer in FIG. 2D.

The feature of the invention lies in that the AlN layer 210 formed above will have a cubic lattice structure with lattice surfaces <100> and <111>, which is different from a hexagonal GaN-group layer that is typically formed using silicon carbide (SiC) or sapphire as a substrate. When the anisotropic etching is conducted, since the etching speed on the surface <100> is lower than that on the surface <111>, the AlN layer 210 can be etched into a prism-shaped, light-receiving layer 216 as shown in FIG. 2D. When an incident light 218 enters the transparent prism-shaped, light-receiving layer 216 from various angles, the incident light 218 will be refracted and focused onto the n-type AlN layer 208 positioned under the layer 216 as shown in FIG. 2E. Therefore, more free electrons will be induced by illumination, and the sensitivity of the transistor being controlled by illumination will be improved.

Another key point of the invention is that at the heterojunction interface between the GaN layer 206 and the n-type AlN layer 208, a narrow potential well will be formed by the different band gaps between these two layers. Stimulated free electrons in the wide band-gap n-type AlN layer 208 will fall into the potential well in the narrow band-gap GaN layer 206. Therefore, as the bias voltage is applied to the source electrode 212a and the drain electrode 214a, a high-speed 2DEG 220 will be formed in the GaN layer 206 near the interface with the n-type AlN layer 208, and its electron mobility is larger than 2000 cm²N.s. As a result, the transistor in the invention, requiring no gate-electrode bias, can be operated as a switch or an amplifier controlled by illumination, and applied to high-power, high-performance devices.

As mentioned above, the n-type AlN layer 208 can also be a p-type AlN layer, which can form a two-dimensional hole gas (2DHG) resulting in a high-mobility conducting effect. Therefore, it does not depart from the spirit of the invention.

Figure 3A:
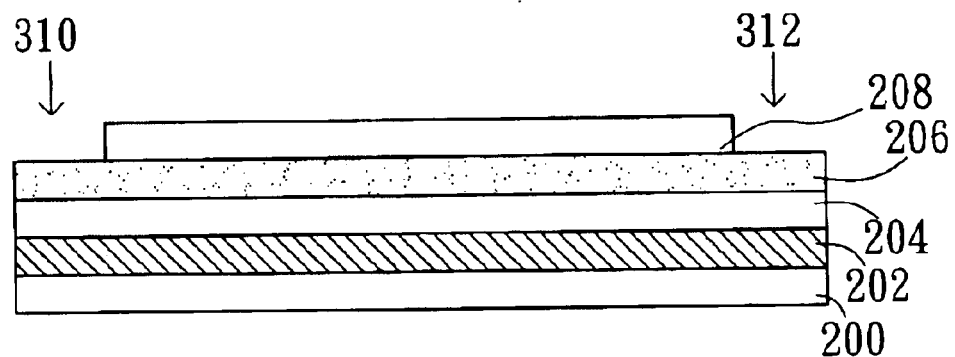
FIG. 3A and FIG. 3B are other steps in manufacturing the prism-shaped, light-receiving layer according to a preferred embodiment of the invention.
Figure 3B:
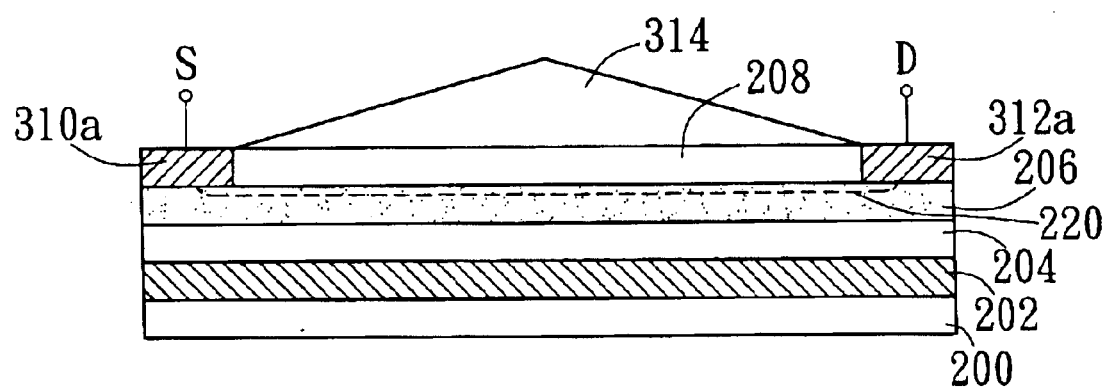

Referring to FIG. 3A, in the procedure for forming the prism-shaped, light-receiving layer 216 mentioned above, a source-electrode region 310 and a drain-electrode region 312 can also be formed first after the n-type AlN layer is formed. Subsequently, silicone-dioxide is used as a mask to cover the source-electrode region 310 and the drain-electrode region 312. Then an AlN selectivity epitaxy is conducted on the n-type AlN layer 208 to form a prism-shaped, light-receiving layer 314. In the final step, a source electrode 312 and a drain electrode 314 are formed to complete the optical-gate transistor fabrication as shown in FIG. 3B. In the selectivity epitaxy, because the AlN layer deposited according to the invention has lattice surfaces <100> and <111>, the speed of the lattice-deposition can be controlled to be lower in parallel (with deposited layers) than on vertical under proper temperature and pressure. Therefore, the light-receiving layer 314 can be induced to form a prism shape.

Figure 4A:
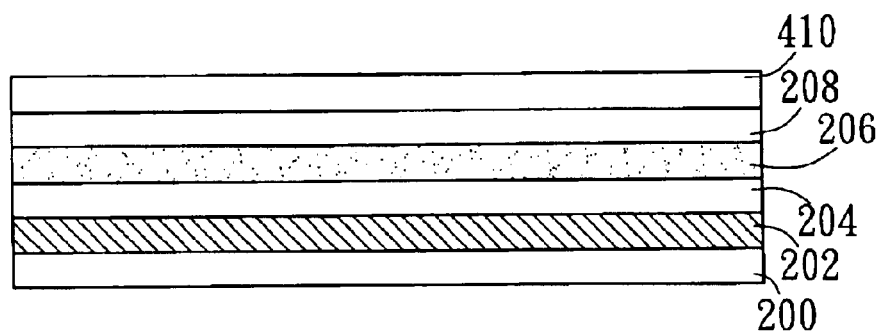
FIGS. 4A to 4C are steps for forming multiple-gate electrodes and prism-shaped, light-receiving layers according to a preferred embodiment of the invention.
Figure 4B:
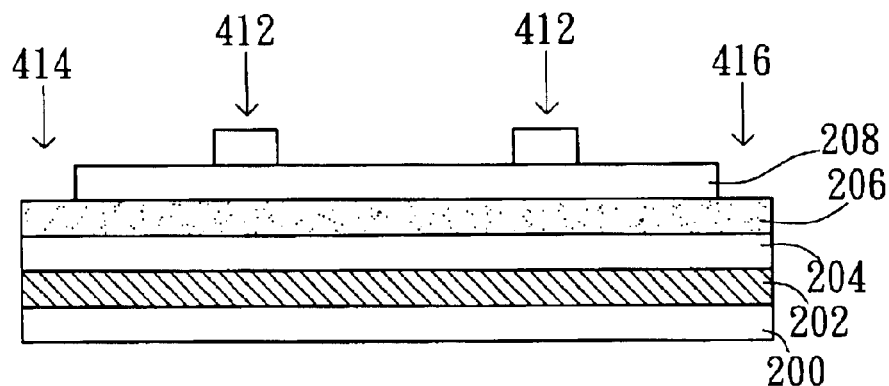
Figure 4C:
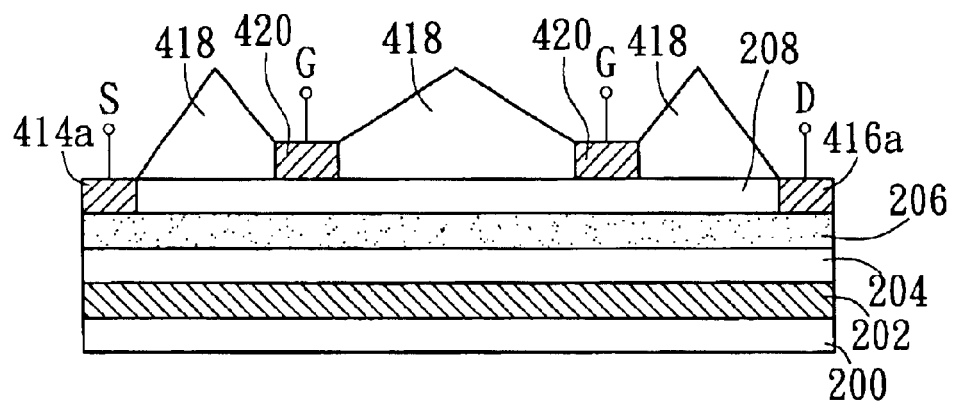

In addition, in the optical-gate transistor of the invention, a silicone-dioxide layer 410 can be formed first as shown in FIG. 4A. The silicone-dioxide layer 410 is patterned by a photolithography and etching method to define multiple-gate electrode regions 412. Afterwards, a source-electrode region 414 and a drain-electrode region 416 are formed by a photolithography and etching method as shown in FIG. 4B. Subsequently, a prism-shaped, light-receiving layer 418 made of an AlN material is formed by the selective epitaxy mentioned above. The silicone-dioxide in the gate-electrode regions 412 is etched off to form multiple-gate electrodes 420, and then a source electrode 414a and a drain electrode 416a are formed as shown in FIG. 4C.

As described above, when an electronic current is generated by illumination on the GaN layer 206, negative bias voltage can be applied to the gate electrodes 420 to increase the intensity of the electronic current. When illumination is stopped, a positive bias voltage can be applied to the gate electrodes 420 so that electrons in the n-type GaN layer are attracted to the gate electrodes to make the conducting channel in the GaN layer 206 disappear, thereby cutting off the electronic current. This avoids a dark current left in a typical optoelectronic device as illumination stops, thereby improving the control efficiency of the optical-gate transistor.

Figure 4D:
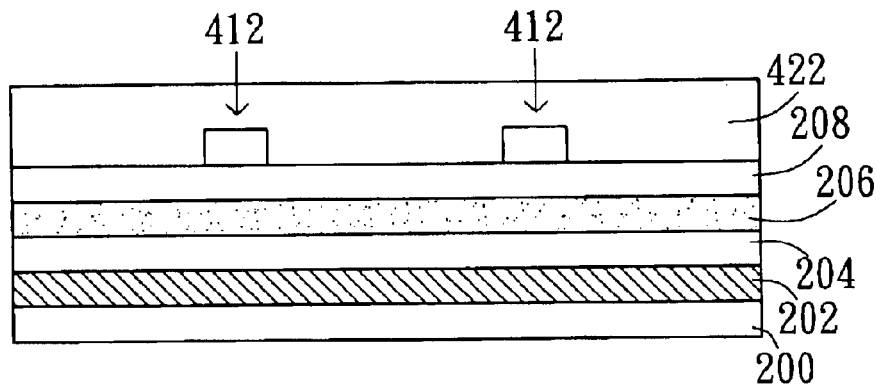
FIGS. 4D to 4F are additional steps for forming multiple-gate electrodes and prism-shaped, light-receiving layers in FIG. 4C.
Figure 4E:
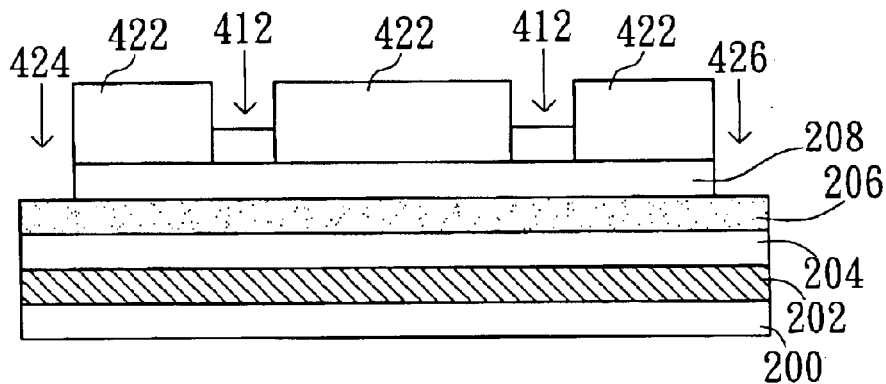
Figure 4F:
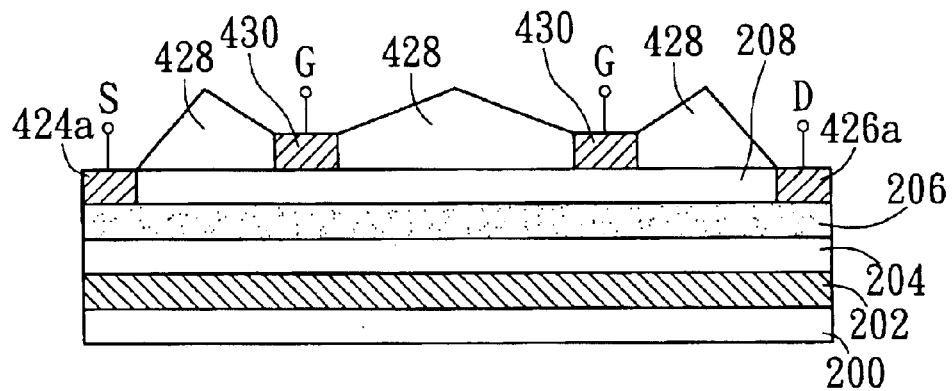

Additionally, an AlN layer 422 can also be formed after the gate-electrode regions 412 are formed as shown in FIG. 4D. Subsequently, a source-electrode region 424 and a drain-electrode region 426 are formed by a photolithography and etching method. AlN materials on the gate-electrode regions 412 are then etched as shown in FIG. 4E. Multiple prism-shaped, light-receiving layers 428 are formed by the anisotropic etching method mentioned above. Silicone-dioxide in the gate-electrode regions 412 is etched to form multiple-gate electrodes 430. Lastly, a source electrode 424a and a drain electrode 426a are formed to complete the fabrication of an optical-gate transistor as shown in FIG. 4F.

The special features of the optical-gate transistor according to the invention disclosed above lie in that the GaN-group materials are used for resisting high temperature and high pressure, and a BP buffer layer is used to form better GaN-group layers with a cubic lattice so that a prism-shaped, light-receiving layer can be formed to receive an incident light instead of a gate electrode, thereby improving the sensitivity of the transistor being controlled by illumination. In addition, the hetero-junction between a doped GaN-group layer and an undoped GaN-group layer is used to generate a high-speed 2DEG, thereby improving the power and performance of the optical-gate transistor. If gate electrodes are designed in the invention, a dark current inherent to a typical photoelectric device can be further reduced, thereby increasing the efficiency of the optical-gate transistor.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An optical-gate transistor, used for receiving an incident light to generate an electronic current, the transistor comprising:

a silicone substrate;

a BP buffer layer, formed on the silicone substrate;

a first AlN layer, formed on the BP buffer layer;

a GaN layer, formed on the first AlN layer;

a source electrode, an n-type AlN layer, and a drain electrode, which are formed on the GaN layer wherein the n-type AlN layer is positioned between the source and the drain electrodes; and a prism-shaped, light-receiving layer is formed on the n-type AlN layer.

2. The transistor according to claim 1, wherein the prism-shaped, light-receiving layer made of any GaN-group material $Al_xIn_yGa_zN$ where $0<x+y+z<1$.

3. The transistor according to claim 1, wherein the first AlN layer, the GaN layer, and the n-type AlN layer can also be made of any GaN-group material $Al_xIn_yGa_zN$ where $0<x+y+z<1$.

4. The transistor according to claim 1, wherein the thickness of the BP buffer layer is about 4000 nm to 5000 nm.

5. The transistor according to claim 1, wherein the electronic current is a high-speed 2DEG located in the GaN layer.

6. The transistor according to claim 1, wherein the n-type AlN layer can also be a p-type layer.

* * * * *